United States Patent
Ueki et al.

(10) Patent No.: US 7,672,352 B2
(45) Date of Patent: Mar. 2, 2010

(54) SURFACE-EMITTING SEMICONDUCTOR ARRAY DEVICE, MODULE, LIGHT SOURCE DEVICE, DATA PROCESSING APPARATUS, LIGHT TRANSMITTING DEVICE, LIGHT SPATIAL TRANSMITTING APPARATUS, AND LIGHT SPATIAL TRANSMITTING SYSTEM

(75) Inventors: Nobuaki Ueki, Kanagawa (JP); Yasuaki Miyamoto, Kanagawa (JP); Jun Sakurai, Kanagawa (JP); Terutaka Inoue, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 285 days.

(21) Appl. No.: 11/728,482

(22) Filed: Mar. 26, 2007

(65) Prior Publication Data

US 2008/0080583 A1 Apr. 3, 2008

(30) Foreign Application Priority Data

Sep. 28, 2006 (JP) ............................. 2006-264958

(51) Int. Cl.
H01S 5/42 (2006.01)
(52) U.S. Cl. .............................. 372/50.124; 372/50.12; 257/88
(58) Field of Classification Search ............ 372/50.124, 372/50.12, 50.122; 257/88
See application file for complete search history.

(56) References Cited

U.S. PATENT DOCUMENTS

| 5,325,381 | A | * | 6/1994 | Paoli | ............................ 372/24 |
| 2002/0009258 | A1 | * | 1/2002 | Coldren et al. | ................. 385/24 |
| 2005/0195876 | A1 | * | 9/2005 | Sato et al. | ................. 372/43.01 |
| 2005/0286597 | A1 | * | 12/2005 | Mukoyama et al. | ....... 372/50.23 |

FOREIGN PATENT DOCUMENTS

| JP | 5-283407 | 10/1993 |
| JP | 2000-12904 | 1/2000 |
| JP | 2003-179137 | 6/2003 |

* cited by examiner

Primary Examiner—Minsun Harvey
Assistant Examiner—Michael Carter
(74) Attorney, Agent, or Firm—Fildes & Outland, P.C.

(57) ABSTRACT

A surface-emitting semiconductor array device includes a substrate, a plurality of light-emitting portions, an electrode pad portion formed on the substrate and disposed through the plurality of light-emitting portions and a dividing groove, and having a plurality of electrode pads formed on an insulating film, and a plurality of metal wirings for connecting each of the plurality of light-emitting portions to a corresponding electrode pad through the dividing groove, the dividing groove has a wave-shaped side wall formed on the substrate.

17 Claims, 9 Drawing Sheets

700  Light transmitting apparatus

800  Video transmitting system

SURFACE-EMITTING SEMICONDUCTOR ARRAY DEVICE, MODULE, LIGHT SOURCE DEVICE, DATA PROCESSING APPARATUS, LIGHT TRANSMITTING DEVICE, LIGHT SPATIAL TRANSMITTING APPARATUS, AND LIGHT SPATIAL TRANSMITTING SYSTEM

BACKGROUND

1. Technical Field

This invention relates to a surface-emitting semiconductor array device, module, light source device, data processing apparatus, light transmitting device, light spatial transmitting apparatus, and light spatial transmitting system.

2. Related Art

A Vertical-Cavity Surface-Emitting Laser diode (hereinafter referred to as VCSEL) is a type of laser diode that emits light from a surface of a semiconductor substrate. As compared with edge-emitting laser diodes, VCSELs require a lower current for driving. Another advantage includes that a nondestructive evaluation, i.e., a wafer-level evaluation, can be performed; and VCSELs can be easily arranged two-dimensionally. Therefore, VCSELs have been used for light sources for optical data processing apparatuses, optical communication devices, or data storage apparatuses using light.

FIG. 16 schematically illustrates an electrode structure of a VCSEL of a related art. In FIG. 16, on a substrate 10 of such as GaAs, a mesa- or post-shaped light-emitting portion 12, and an electrode pad portion 16 isolated by a dividing groove 14 from the light-emitting portion 12 are formed. The light-emitting portion 12 includes plural semiconductor layers (not shown) stacked on the substrate, and on a top portion thereof, an electrode layer 18 is formed. The electrode layer 18 forms a window (opening portion) 20 for emitting laser light at a top portion the light-emitting portion 12, and allows current injection into the light-emitting portion 12. The sidewall of the light-emitting portion 12, the dividing groove 14 and the electrode pad portion 16 are covered with an interlayer insulating film 22. The electrode layer 18 is connected to an electrode pad 24 by a metal wire 18a formed on the interlayer insulating film 22. To the electrode pad 24, a metal ball 26 is bonded, and a bonding wire 28 connected to the metal ball 26 is connected to a mount member, lead frame, or the like.

When a certain pressure or vibration is applied to the electrode pad 24 during bonding of the metal ball 26, the electrode pad 24 or the metal wire 18a may peel off from the interlayer insulating film 22. The pressure or vibration may also cause the interlayer insulating film 22 to be easily released from the underlying semiconductor layer.

As shown in FIG. 17, in the electrode configuration of a VCSEL array of a related art, a side wall 14a of the dividing groove 14 that divides the light-emitting portion 12 and the electrode pad portion 16 is a straight line. With such simple shape, pressure or vibration during bonding easily propagates, and there has been an issue in that the electrode pad 24 (metal wire 18a) or the interlayer insulating film 22 may peel off, especially in the vicinity of a stepped portion A of the electrode pad portion 16.

In addition, in a case where the light-emitting portion 12 and the electrode pad portion 16 are closely positioned in a substrate plane, pressure or vibration during bonding may propagate through the interlayer insulating film 22 that covers the substrate surface, and thus propagate close to the light-emitting portion 12, and the metal wire 18a or the electrode layer 18 routed in the dividing groove 14 may peel off from the interlayer insulating film 22. Such event significantly reduces the reliability of the VCSEL array, and is undesirable.

The present invention aims to improve adhesion of a metal wiring, electrode pad, and interlayer insulating film, and provide a small and highly reliable surface-emitting semiconductor array device.

SUMMARY

An aspect of the present invention provides a surface-emitting semiconductor array device that includes a substrate, a plurality of light-emitting portions, an electrode pad portion formed on the substrate and disposed through the plurality of light-emitting portions and a dividing groove, and having a plurality of electrode pads formed on an insulating film, and a plurality of metal wirings for connecting each of the plurality of light-emitting portions to a corresponding electrode pad through the dividing groove, the dividing groove has a wave-shaped side wall formed on the substrate.

BRIEF DESCRIPTION OF THE DRAWINGS

Embodiment(s) of the present invention will be described in detail based on the following figures, wherein.

DETAILED DESCRIPTION

Examples of a VCSEL according to an aspect of the present invention will be now described in detail, referring to the accompanying figures.

Figure 1:
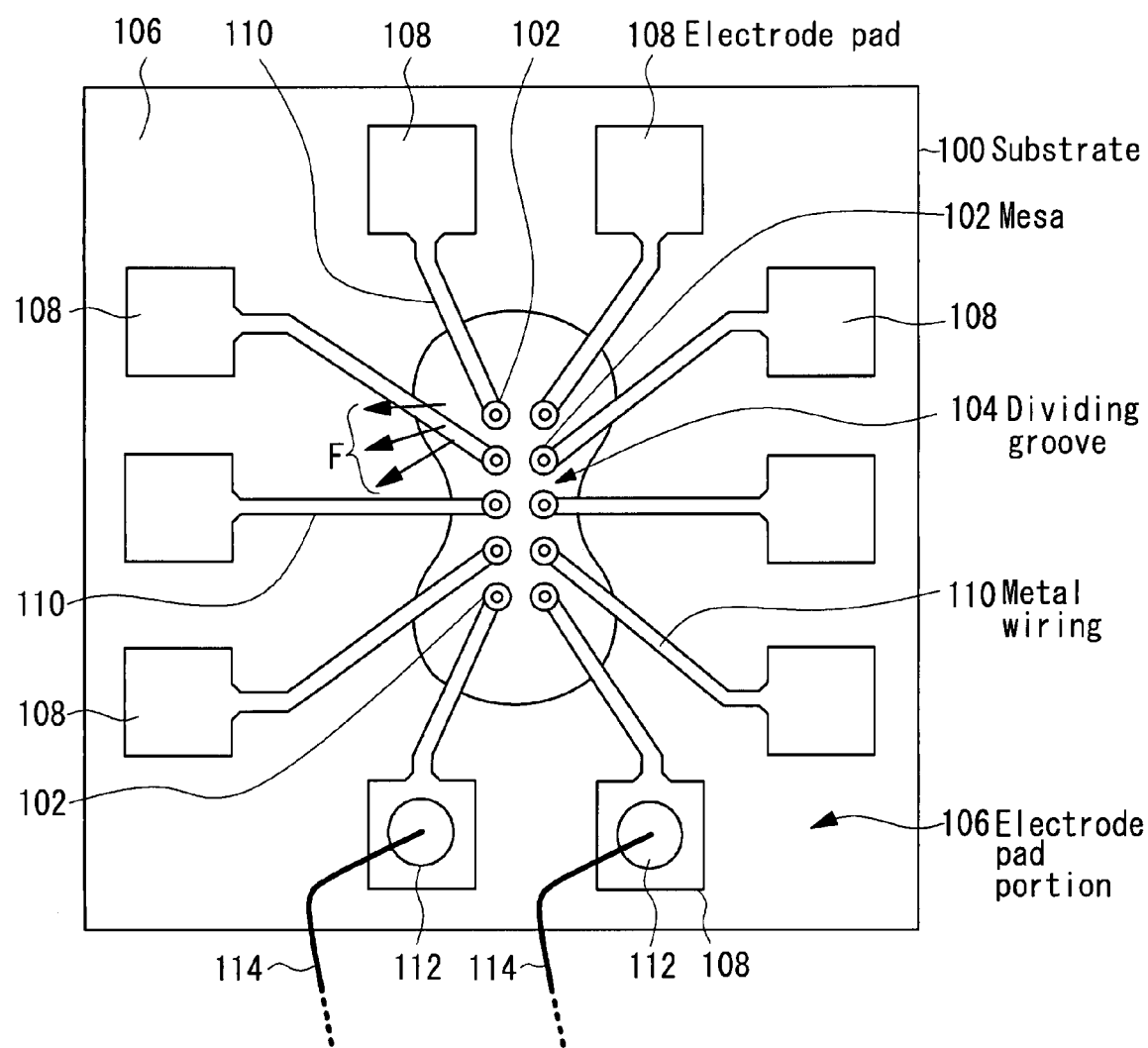
FIG. 1 is a plan view illustrating a configuration of a VCSEL array according to an example of the present invention.

FIG. 1 is a plan view of a VCSEL array according to an example of the present invention. As shown, at an approximately center portion of a rectangular substrate (chip) 100, cylindrical or rectangular prism-shaped (collectively referred to as post-shaped) mesas 102 are formed. The mesas 102 are light-emitting portions arranged in an arrangement of 5×2. To surround the circumference of the mesas 102, a dividing groove 104 having a wave-shaped sidewall is formed. It is preferable that the dividing groove 104 has a depth that reaches the substrate or a predetermined semiconductor layer on the substrate, and the wave shape of the dividing groove 104 is formed such that it extends in a direction horizontal to the substrate.

Surrounding portion of the substrate isolated by the dividing groove 104 is an electrode pad portion 106. On the electrode pad portion 106, plural electrode pads 108 are formed through an interlayer insulating film. The electrode pad portion 106 is a region where the plural electrode pads 108 are disposed through the interlayer insulating film. The electrode pads 108 are connecting portions that connect wirings, for example, metal wires, for electrically connecting with outside. Each of the electrode pads 108 is electrically connected to a p-side electrode layer 134 (see FIG. 2) of the corresponding mesa 102 via a metal wiring 110 that extends radially. In addition, to the electrode pad 108, a metal ball 112 (in FIG. 1, metal balls are shown for only two electrode pads) is connected during wire bonding. The metal ball 112 is electrically connected to a mount member, lead frame, or the like (not shown) via a metal wire 114.

Figure 2:
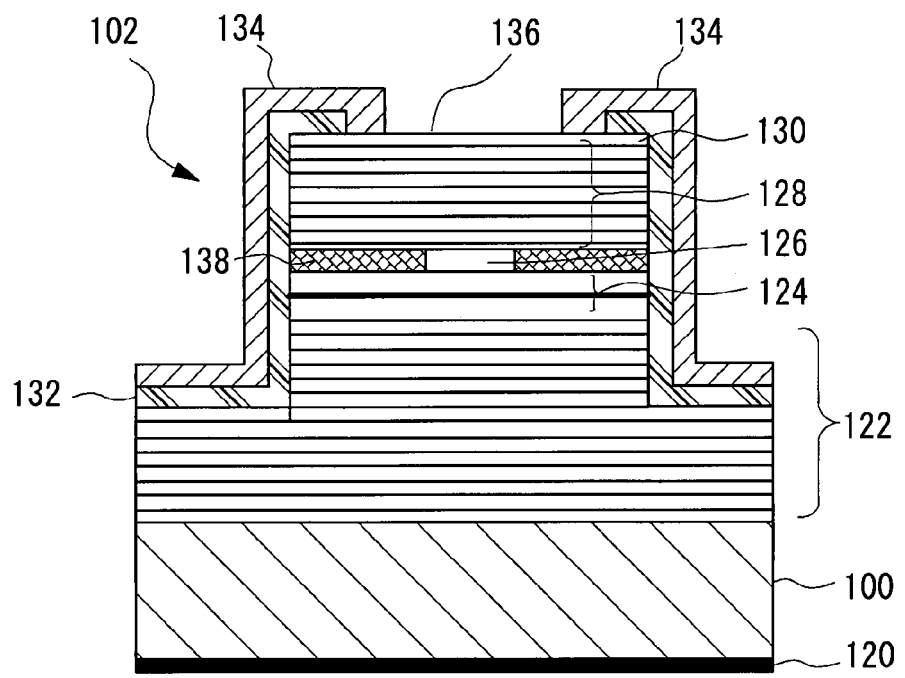
FIG. 2 is a cross sectional view of one mesa of a VCSEL array.

FIG. 2 is a cross sectional view illustrating a configuration of one mesa of a VCSEL array. As shown in FIG. 2, on the GaAs substrate 100 on which an n-side lower electrode 120 is formed, an n-type lower semiconductor multilayer reflective mirror 122, an active region 124, a p-type AlAs layer 126, a p-type upper semiconductor multilayer reflective mirror 128 are stacked in this order. In the topmost layer of the upper multilayer reflective mirror 128, a contact layer 130 made of p-type GaAs is formed. The cylindrical mesa 102 is formed from the upper multilayer reflective mirror 128 to a portion of the lower multilayer reflective mirror 122. The mesa 102 is thermally processed in a vapor atmosphere at a high temperature to form an oxidized region 138 in the circumference of the AlAs layer 126 in the mesa 102, thereby a light confined region that also acts as a current-confined layer is formed in the AlAs layer 126.

The bottom portion, side surface, and a portion of top portion of the mesa 102 are covered with an interlayer insulating film 132. At a top portion of the mesa 102, a contact hole is formed in the interlayer insulating film 132, from which the p-side electrode layer 134 is ohmic-contacted to the contact layer 130. At a center portion of the p-side electrode layer 134, a round-shaped opening 136 is formed to emit laser light.

The n-type lower semiconductor multilayer reflective mirror 122 may be formed by alternately stacking plural periods of, for example, $Al_{0.9}Ga_{0.1}As$ and $Al_{0.3}Ga_{0.7}As$, and the thickness of each layer is $\lambda/4n_r$ (where $\lambda$ is lasing wavelength, $n_r$ is optical refractive index of the medium). The active region 124 may include, for example, an undoped lower $Al_{0.5}Ga_{0.5}As$ spacer layer and an undoped quantum well active layer and an undoped upper $Al_{0.5}Ga_{0.5}As$ spacer layer. The p-type upper semiconductor multilayer reflective mirror 128 may be formed by alternately stacking plural periods of, for example, $Al_{0.9}Ga_{0.1}As$ and $Al_{0.3}Ga_{0.7}As$, and the thickness of each layer is ¼ of the wavelength in the medium. In the bottommost layer of the upper semiconductor multilayer reflective mirror 128, the low resistant p-type AlAs layer 126 is included. In the topmost portion of the upper semiconductor multilayer reflective mirror 128, the p-type GaAs contact layer 130 having a carrier concentration of $1\times10^{19}$ cm$^{-3}$, for example, maybe stacked. The p-side electrode layer 134 may be formed of Au, for example; and the n-side electrode 120 may be formed of Au/Ge, for example. The interlayer insulating film 132 may be formed of SiNx, for example.

Figure 16:
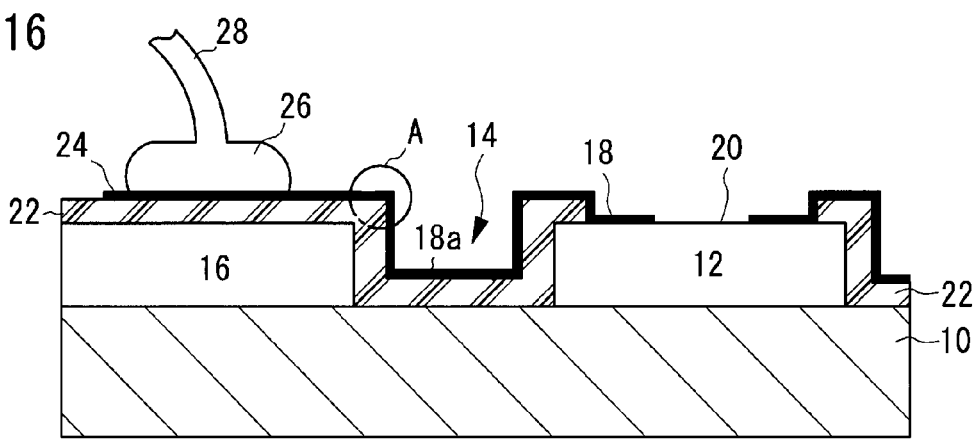
FIG. 16 is a cross sectional view illustrating a schematic configuration of a VCSEL array of a related art.
Figure 17:
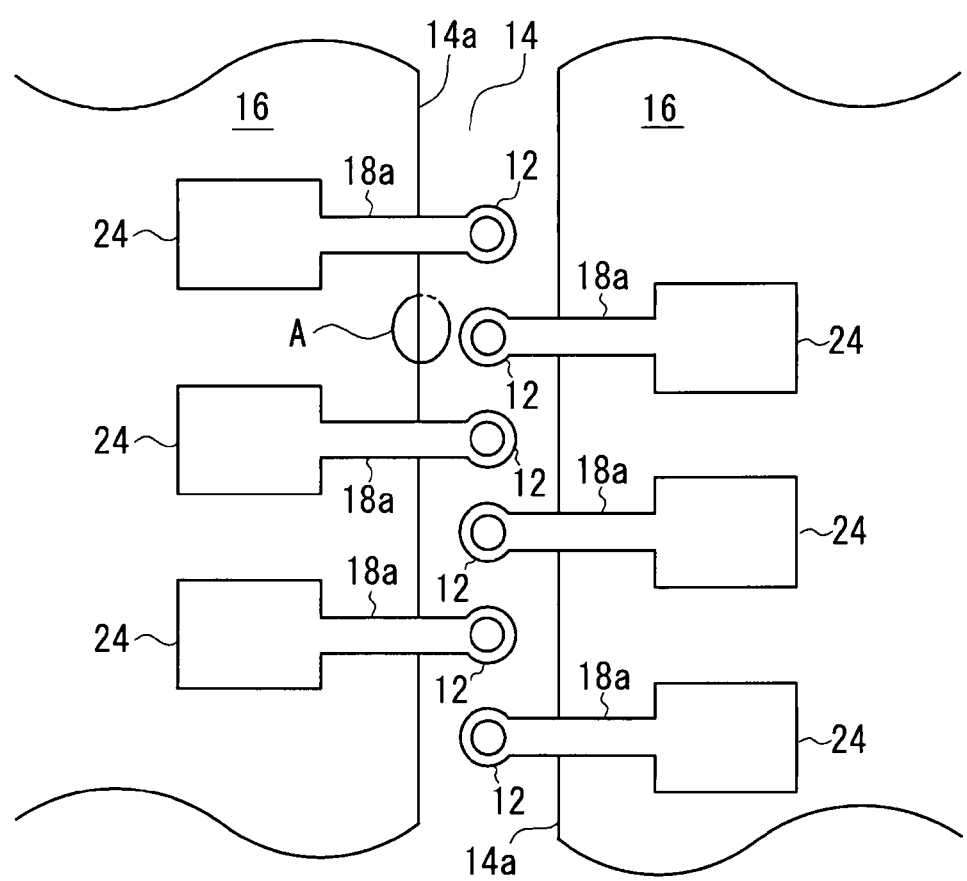
FIG. 17 is a plan view illustrating a schematic configuration of a VCSEL array of a related art.

By etching the plural semiconductor layers stacked on the substrate 100, the mesas 102 in an arrangement of 5×2 are formed, and at the same time, the dividing groove 104 is formed. Each of the mesas 102 is divided each other, and physically and electrically isolated from the electrode pad portion 106. The electrode pad portion 106 has a same semiconductor stacking structure as the mesa 102 does, and on the topmost of the structure, the interlayer insulating film 132 is formed. At predetermined positions on the interlayer insulating film 132, plural rectangular electrode pads 108 are formed. Each of the electrode pads 108 is connected to the p-side electrode layer 134 of the corresponding mesa 102 via the metal wiring 110. The interlayer insulating film 132 covers the sidewall and bottom surface of the dividing groove, and linked to the interlayer insulating film of the electrode pad portion 106 through the stepped portion (see FIG. 16) of the dividing groove. The metal wiring 110 extends along the bottom surface and side surface through the stepped portion of the dividing groove 104 to the electrode pad 108. The metal wiring 110, p-side electrode layer 134, and electrode pad 108 may be simultaneously formed in a process of patterning an electrode layer.

In a VCSEL array according to the example, each of the metal wirings 110 is extracted radially from the mesa 102 functioning as the light-emitting portion, and thus the sidewall of the dividing groove 104 is made into a wave-shape in its entire circumference. By forming the side wall of the dividing groove 104 in a wave-shape, as compared with a VCSEL array of a related art in which the shape is a simple straight line or curved line, the contact area between the semiconductor layers on the side wall of the dividing groove 104 and the interlayer insulating film 132, and contact area between the interlayer insulating film 132 and the metal wiring 110 are increased. Therefore, the stress F (see FIG. 1) toward directions of the stepped portion of the dividing groove 104 or corners of the electrode pad portion 106 is dispersed or reduced, and thus adhesion between the interlayer insulating film 132 and the underlying semiconductor layer, and between the interlayer insulating film 132 and the metal wirings 110 is improved. In addition, peeling of the electrode pad 108, the metal wiring 110, and the interlayer insulating film 132 in the vicinity of corners of the electrode pad portion 106, which is caused by the stress or vibration applied on the electrode pad portion 106 during bonding, may be prevented.

In addition, it is known that such stress may occur not only due to a process factor such as bonding, but also due to an environmental factor, for example, high temperature or high humidity environment. This may be an event that is caused mainly due to thermal shrinkage, thermal expansion caused by temperature variation, or expansion by moisture absorption of a material. Even in such case, the dividing groove 104 whose sidewall is a wave shape can contribute to similar stress dispersion, and prevent peeling of the interlayer insulating film 132 or the metal wiring 110.

Figure 3:
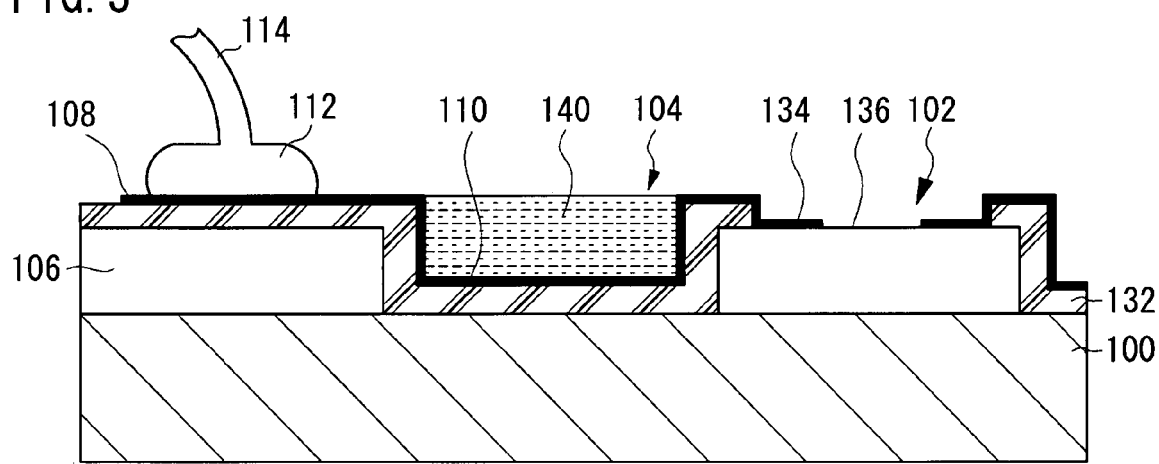
FIG. 3 is a cross sectional view in which polyimide is filled in a dividing groove formed in a VCSEL array.

When finally encapsulating the VCSEL array in a package of resin, can, or the like, it is possible to fill inside of the dividing groove 104 with a polymer resin 140 of polyimide or the like. As shown in FIG. 3, for the purpose of reducing the stress of the metal wiring 110 whose wiring portion is routed along the bottom of a deep groove or the side wall, planarization can be performed by filling the polyimide 140 of a kind of polymer resin. In this method, thermal shrinkage, thermal expansion, or expansion due to moisture absorption of the polyimide itself may be of concern; however, the wave-shaped side wall of the dividing groove 104 according to this example reduces the stress of the polyimide resin 140.

Figure 4A:
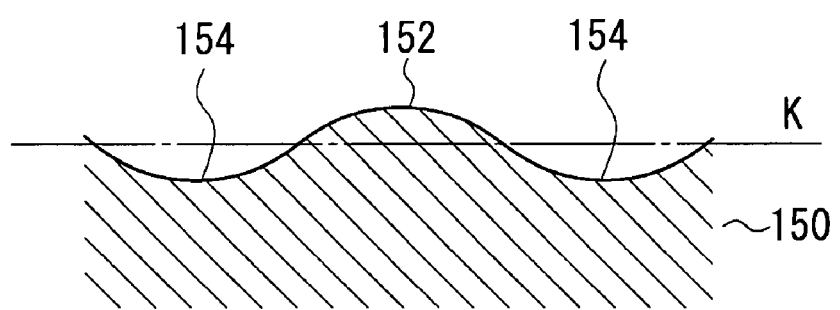
FIGS. 4A and 4B illustrate a waving shape formed on a side wall of a dividing groove.
Figure 4B:
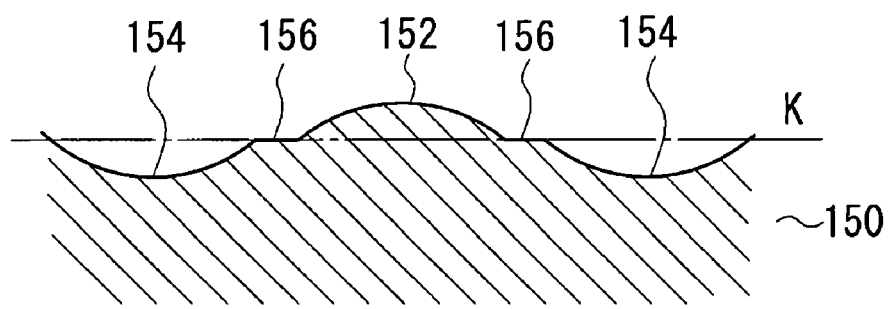

Next, exemplary aspects of a wave shape formed on the sidewall of the dividing groove will be shown. The shape or arrangement of the dividing groove, arrangement of mesas, and the number of the mesas may be varied depending on purposes or applications as needed. In the example described above, mesas are arranged in an arrangement of 5×2; however, of course, it may be other arrangement than this. As shown in FIG. 4A, the wave shape formed on the sidewall of the dividing groove includes a convex curved surface 152 that protrudes from a straight virtual line K that is approximately in parallel with a sidewall 150 of the dividing groove, and a concave curved surface 154 that is dented from the virtual line K. In the wave shape shown in FIG. 4A, the convex curved surface 152 and the concave curved surface 154 are continuously connected; however, as shown in FIG. 4B, the convex curved surface 152 and the concave curved surface 154 may be partially uncontinuously connected, and a straight region 156 maybe included therebetween. In such case, however, the metal wiring 110 should not be routed on the straight region 156.

The convex curved surface 152 and the concave curved surface 154 may be any one of an ellipse shape, sinusoidal wave shape, arc shape, or a potion thereof, or a combination thereof. By having such shape, the stress of the interlayer insulating film 132 or the metal wiring 110 in the stepped portion of the dividing groove 104 maybe uniformly reduced. In addition, the size, number, arrangement of the convex curved surface 152 and the concave curved surface 154 may be selected as needed depending on the number, pitch, and arrangement of the mesas 102 as well as the thickness, routing direction of the metal wiring, or the like.

Figure 5A:
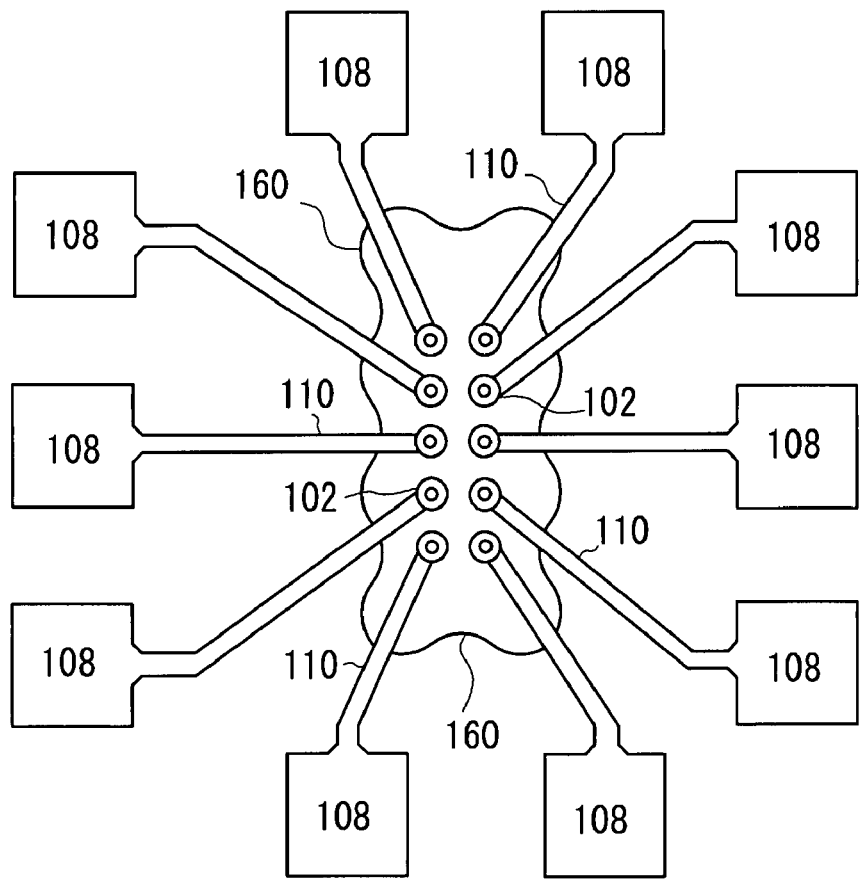
FIGS. 5A and 5B are plan views illustrating other examples of a VCSEL array according to an example of the present invention.
Figure 5B:
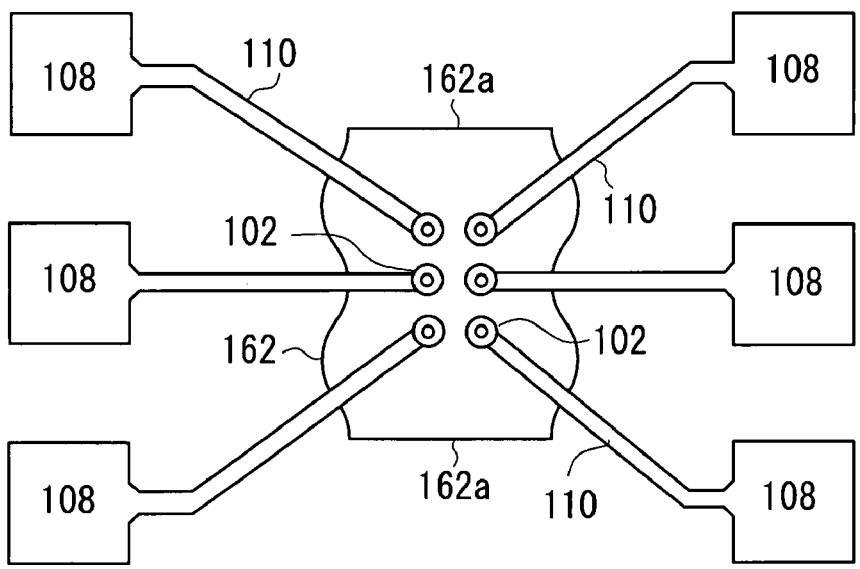

For example, as shown in FIG. 5A, in a case where the mesas 102 are arranged in an arrangement of 5×2, a dividing groove 160 is formed in a long shape to conform to the direction of the arrangement. As the number of the mesas 102 increases, the number of the metal wirings 110 also increases, and the pitch between the metal wirings 110 becomes narrower, and thus the wave shape of the sidewall of the dividing groove 160 may be made finer. In FIG. 5A, compared with the case of the side wall of the dividing groove 104 shown in FIG. 1, the number of the convex curved surfaces and concave curved surfaces formed on the side wall of the dividing groove 160 is increased, and the pitch therebetween is reduced. As shown in FIG. 5B, in a case where the number of the mesas 102 is fewer and the electrode wirings are extracted on both sides of the mesas 102, side walls 162a above and below a dividing groove 162 may be formed in straight lines, and only side walls on the right and left may be formed in a wave shape.

In a case where the mesas 102 are formed in two columns, the side wall of the dividing groove that opposes each of the rows may be formed in a wave shape; however, in a case where the mesas 102 are formed in one row and the electrode wirings are extracted only one side of the row, only the side wall of the dividing groove on the one side may be formed in a wave shape. Such wave shape is preferably a wave shape in a horizontal direction with respect to the substrate.

The metal wiring, originally provided for current injection, has a higher thermal conductivity than the semiconductor material, silicon-based inorganic insulating film, or the like. Therefore, the metal wiring itself may work as a heat dissipation material and contribute to reduction of thermal stress, and can precautionary eliminate factors of film peeling.

Figure 6:
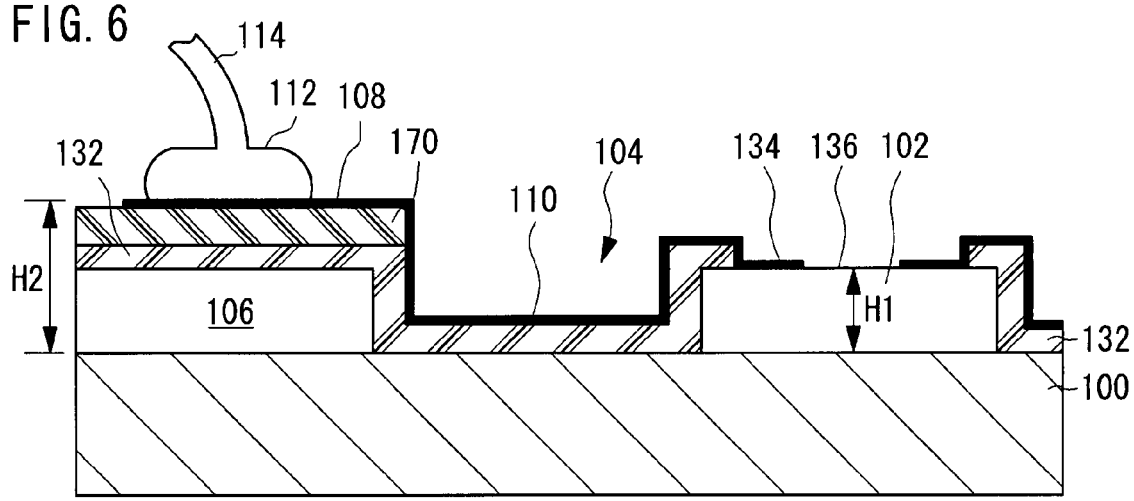
FIG. 6 is a cross sectional view illustrating another example of a VCSEL array according to an example of the present invention.

The relationship of the heights between a mesa of a VCSEL array and an electrode pad portion will be now described. FIG. 6 shows a cross sectional view illustrating another configuration of a VCSEL array. The electrode pad portion 106 and the mesa 102 have a same semiconductor layers stacked on the substrate as described above. However, on the interlayer insulating film 132 on the electrode pad portion 106, a thick interlayer insulating film 170 is added. In other words, between the electrode pad 108 and the semiconductor layers, the interlayer insulating films 170, 132 are interposed. As such, by forming the thick interlayer insulating film 170 between the electrode pad 108 and the semiconductor layers, the stress or vibration applied during bonding may be absorbed in the interlayer insulating films 132, 170, and the propagation of the stress or vibration to the stepped portion of the dividing groove 104 or the mesa 102 may be reduced. The interlayer insulating film 170 may be selectively formed on the electrode pad portion 106 by masking the mesa 102, after the formation of the interlayer insulating film 132.

The height H2 of the electrode pad portion 106 is made higher than the height H1 of the mesa 102. By making the relation, H1<H2, an event may be prevented in which, when a capillary for providing a gold wire during bonding or a die collet for clamping a chip or the like is moved, the tip of such tool inadvertently contacts the mesa 102, which is the light-emitting portion.

Figure 7:
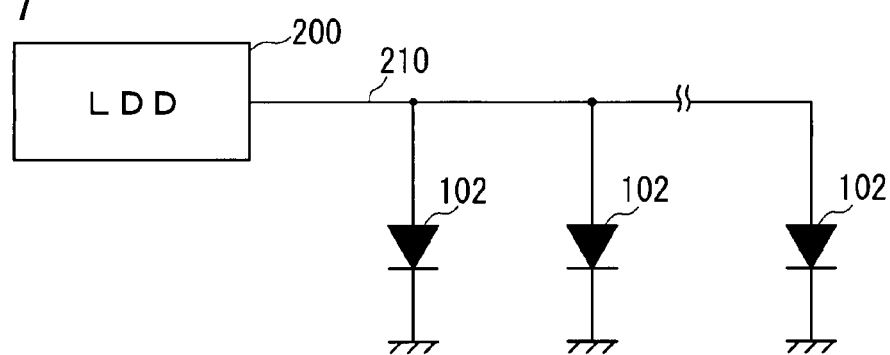
FIG. 7 illustrates at example of a circuit configuration for driving a VCSEL array.

FIG. 7 illustrates a configuration of a circuit for driving a multi-spot type VCSEL array. A Laser Diode Driver (LDD) 200 provides a driving signal 210 in response to an inputted drive control signal to the plural mesas 102 formed on the substrate. The driving signal 210 is provided to each of the electrode pads 108 in the electrode pad portion 106 shown in FIG. 1. By the signal, the mesas 102 are simultaneously driven, and plural laser lights are simultaneously emitted through the openings 136 on top portion of the mesas in a direction vertical with respect to the substrate. That is, the driving signal 210 of the LDD 200 is converted into an optical signal, and injected into an optical fiber, for example.

A VCSEL array according to the example may be encapsulated in a ceramic package, can package, resin package, or the like, and used as a semiconductor layer device that emits laser light by providing the driving signal 210 described above to a lead terminal exposed outward from the package.

Figure 8:
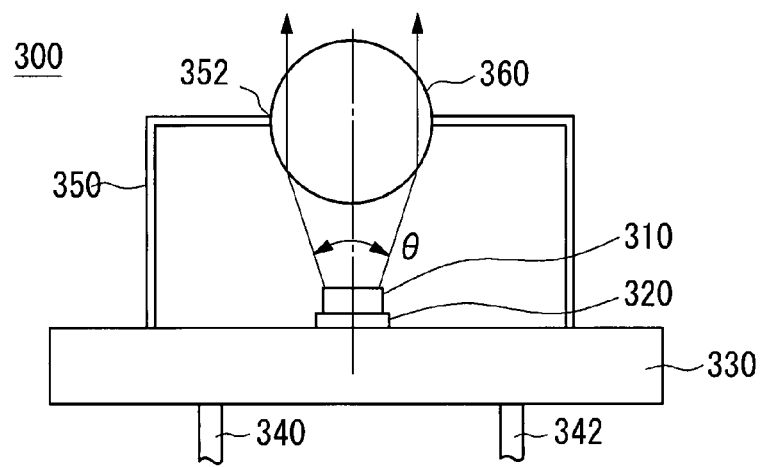
FIG. 8 is a schematic view illustrating a configuration of a package in which a VCSEL array is implemented.

FIG. 8 is a cross sectional view illustrating a configuration of a package (module) in which a VCSEL array is implemented. In a package 300, a chip 310 on which a VCSEL array is formed is fixed on a disc-shaped metal stem 330 through a conductive adhesion 320. Electrical connection terminals 340 and 342 are inserted into through holes (not shown) formed in the stem 330. One electrical connection terminal 340 is electrically connected to an n-side electrode formed on the back surface of the chip 310, and the other electrical connection terminal 342 is electrically connected to a p-side electrode formed on the upper surface of the chip 310 through a bonding wire or the like. The electrical connection terminals may be conductive lead terminals, for example.

On the stem 330, a rectangular hollow cap 350 is fixed to contain the chip 310, and a ball lens 360 is fixed in a center opening of the cap 350. The optical axis of the ball lens 360 is positioned to match an approximate center of the chip 310. When a forward voltage is applied between the electrical connection terminals 340 and 342, laser light is emitted from each mesa of the chip 310. The distance between the chip 310 and the ball lens 360 may be adjusted so that the ball lens 360 is contained within the radiation angle θ of the laser light from the chip 310. In addition, in the cap, a light-sensing element may be contained to monitor the emitting status of the VCSEL.

Figure 9:
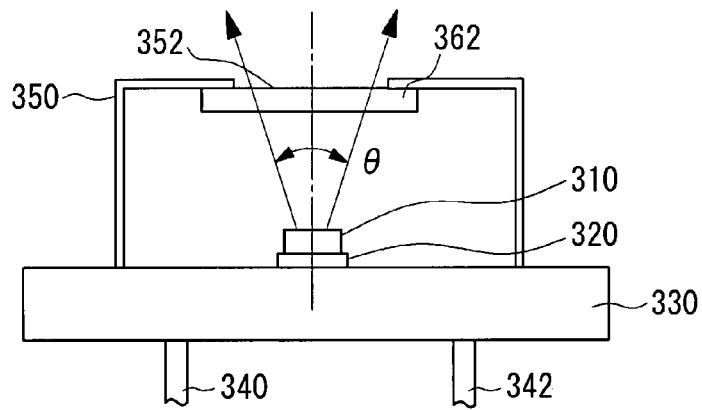
FIG. 9 is a schematic view illustrating another configuration of a package in which a VCSEL array is implemented.

FIG. 9 illustrates another package configuration, which is preferably used for a spatial transmitting system described later. In a package 302 shown in FIG. 9, instead of using the ball lens 360, a flat window cap (glass) 362 is fixed in a center opening of the cap 350. The center of the flat window cap (glass) 362 is positioned to match an approximate center of the chip 310. The distance between the chip 310 and the flat window cap (glass) 362 may be adjusted so that the opening diameter of the flat window cap (glass) 362 is equal to or greater than the radiation angle θ of the laser light from the chip 310.

Figure 10:
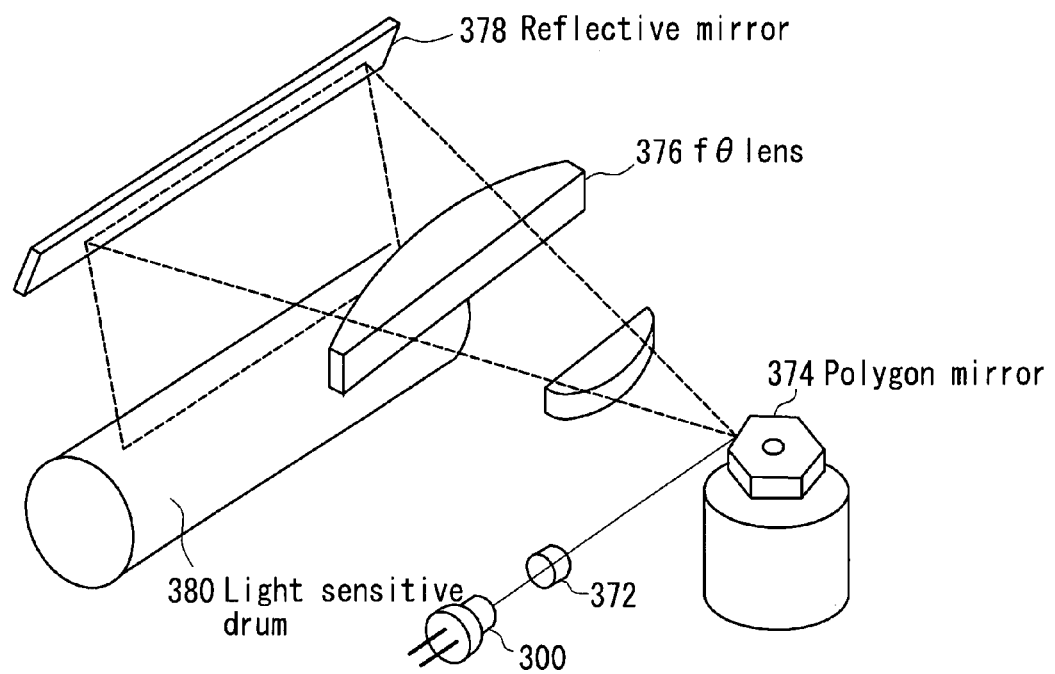
FIG. 10 illustrates an example of a configuration of a light source device using a VCSEL array.

FIG. 10 illustrates an example in which a VCSEL array is used as a light source. A light source device 370 includes the package 300 (302) in which a VCSEL array is implemented as in FIG. 8 or FIG. 9, a collimator lens 372 that receives multi-beam laser light emitted from the package 300, a polygon mirror 374 that rotates at a certain speed and reflects light rays from the collimator lens 372 with a certain divergence angle, an fθ lens 376 that receives laser light from the polygon mirror 374 and projects it on a reflective mirror 378, the line-shaped reflective mirror 378, and a light sensitive drum 380 that forms a latent image based on the reflected light from the reflective mirror 378. As such, a VCSEL array can be used for a light source for optical data processing apparatus, for example, a copy machine or printer equipped with an optical system that collects laser light from a VCSEL array on a light sensitive drum, and a mechanism that scans collected laser light on the light sensitive drum.

Figure 11:
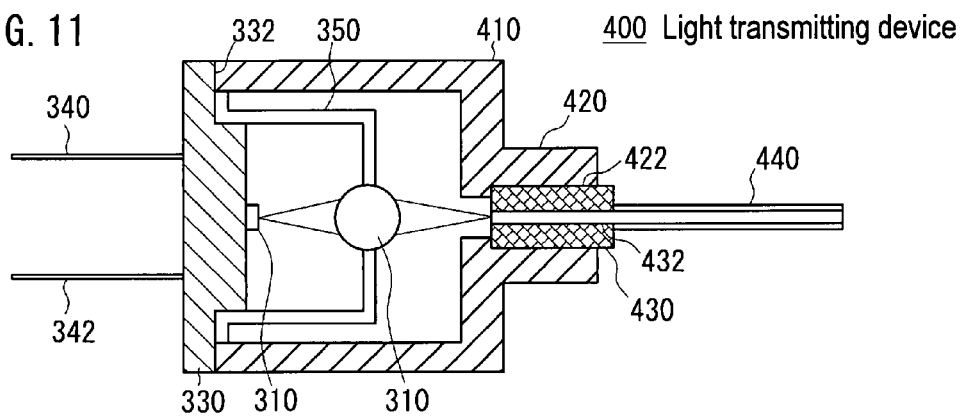
FIG. 11 is a cross sectional view illustrating a configuration of a light transmitting device that uses the package shown in FIG. 8.

FIG. 11 is a cross sectional view illustrating a configuration in which the package or module shown in FIG. 8 is applied to a light transmitting device. A light transmitting device 400 includes a cylindrical housing 410 fixed to the stem 330, a sleeve 420 formed integral with the housing 410 on the edge surface thereof, a ferrule 430 held in an opening 422 of the sleeve 420, and an optical fiber 440 held by the ferrule 430. In a flange 332 formed in a direction of the circumference of the stem 330, an edge portion of the housing 410 is fixed. The ferrule 430 is positioned exactly in the opening 422 of the sleeve 420, and the optical axis of the optical fiber 440 is aligned with the optical axis of the ball lens 360. In a through hole 432 of the ferrule 430, the core of the optical fiber 440 is held.

Laser light emitted from the surface of the chip 310 is concentrated by the ball lens 360. The concentrated light is injected into the core of the optical fiber 440, and transmitted. While the ball lens 360 is used in the above example, other lens such as a biconvex lens or a plano-convex lens may be used. In addition, the light-transmitting device 400 may include a driving circuit for applying an electrical signal to the leads 340 and 342. Furthermore, the light-transmitting device 400 may have receiving function to receive an optical signal via the optical fiber 440.

Figure 12:
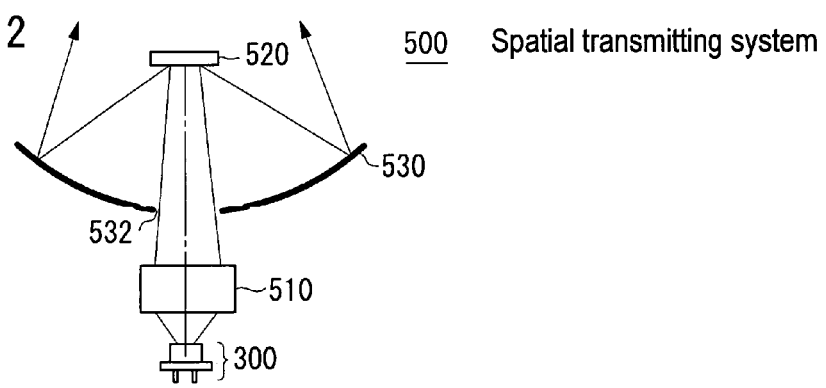
FIG. 12 illustrates a configuration of a spatial transmitting system.

FIG. 12 illustrates a configuration in which the package shown in FIG. 9 is used in a spatial transmitting system. A spatial transmitting system 500 includes the package 300, a condensing lens 510, a diffusing plate 520, and a reflective mirror 530. The light concentrated by the condensing lens 510 is reflected by the diffusing plate 520 through an opening 532 of the reflective mirror 530. The reflected light is reflected toward the reflective mirror 530. The reflective mirror 530 reflects the reflected light toward a predetermined direction to perform optical transmission.

Figure 13:
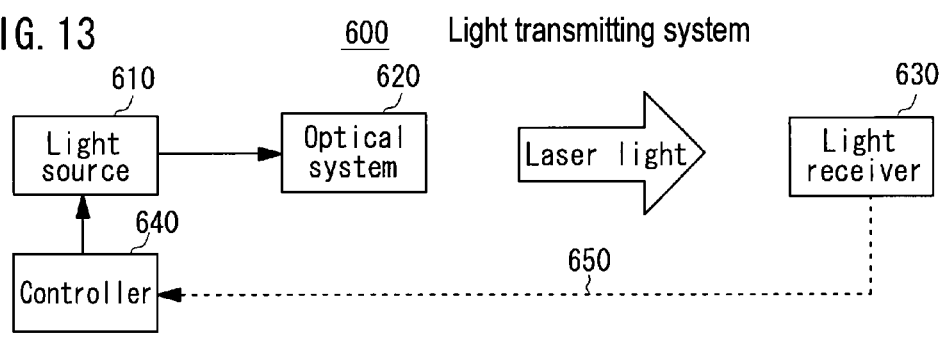
FIG. 13 is a block diagram illustrating a configuration of a light transmitting system.

FIG. 13 illustrates an exemplary configuration of a light transmitting system in which a VCSEL is used as a light source. A light transmitting system 600 includes a light source 610 that contains a chip 310 on which a VCSEL array is formed, an optical system 620, for example, for concentrating laser light emitted from the light source 610, a light receiver 630 for receiving laser light outputted from the optical system 620, and a controller 640 for controlling the driving of the light source 610. The controller 640 provides a driving pulse signal for driving the VCSEL to the light source 610. The light emitted from the light source 610 is transmitted through the optical system 620 to the light receiver 630 by an optical fiber or a reflective mirror for spatial transmission. The light receiver 630 detects the received light by a photodetector, for example. The light receiver 630 is capable of controlling operations (for example, the start timing of optical transmission) of the controller 640, by a control signal 650.

Figure 14:
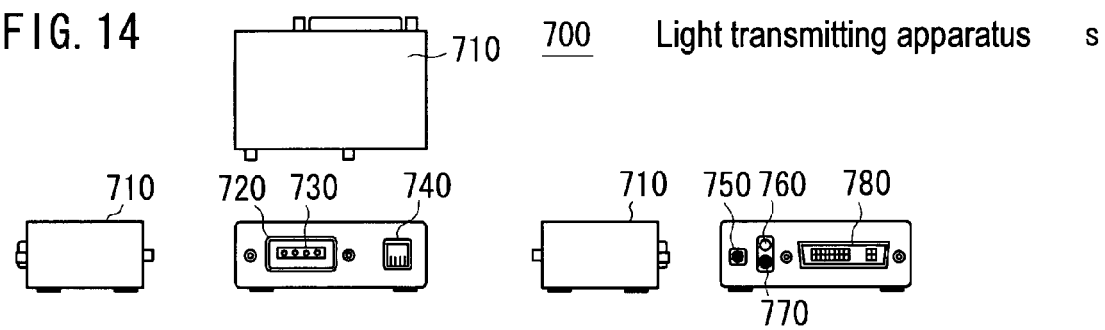
FIG. 14 illustrates an outer configuration of a light transmitting apparatus.

Referring now to FIG. 14, a general configuration of a light transmitting apparatus used for a light transmitting system is shown. A light transmitting apparatus 700 includes a case 710, an optical signal transmitting/receiving connector 720, a light-emitting/light-receiving element 730, an electrical signal cable connector 740, a power input 750, an LED 760 for indicating normal operation, an LED 770 for indicating an abnormality, and a DVI connector 780. Inside the apparatus, a transmitting circuit board/receiving circuit board is contained.

Figure 15:
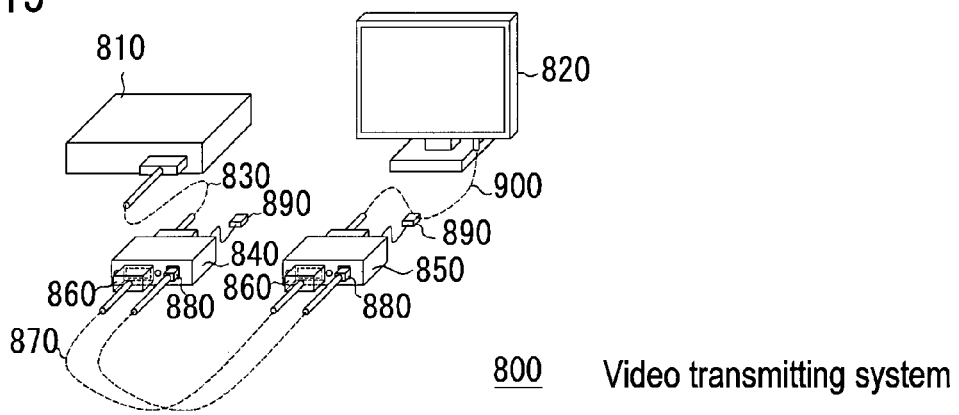
FIG. 15 illustrates a video transmitting system that uses the light transmitting apparatus of FIG. 14.

Referring to FIG. 15, a video transmitting system is shown in which the light transmitting apparatus 700 is used. A video transmitting system 800 uses the light transmitting apparatus shown in FIG. 14 to transmit a video signal generated at a video signal generator 810 to an image display 820 such as a liquid crystal display. More specifically, the video transmitting system 800 includes a video signal generator 810, an image display 820, an electrical cable 830 for DVI, a transmitting module 840, a receiving module 850, a connector 860 for video signal transmission, an optical fiber 870, an electrical cable connector 880 for control signal transmission, a power adapter 890, and an electrical cable 900 for DVI.

In the video transmitting system described above, the transmissions between the video signal generator 810 and the transmitting module 840, and between the receiving module 850 and the image display 820 are performed by an electrical signal through the electrical cables 830 and 900 respectively. However, these transmissions may be performed by an optical signal. For example, instead of using electrical cables 830 and 900, a signal transmitting cable in which an electrical/optical converter circuit and an optical/electrical converter circuit are contained in a connector may be used.

The foregoing description of the examples has been provided for the purposes of illustration and description, and it is not intended to limit the scope of the invention. It should be understood that the invention might be implemented by other methods within the scope of the invention that satisfies requirements of a configuration of the present invention.

A surface-emitting semiconductor array device according to the present invention is applicable to light-emitting devices such as LEDs or laser diodes that may be arranged in one- or two-dimensionally on a substrate, and can be used for light sources for optical communication or optical storage.

What is claimed is:

1. A surface-emitting semiconductor array device comprising:
   a substrate;
   a plurality of light-emitting portions;
   an electrode pad portion formed on the substrate and separated from the plurality of light-emitting portions by a dividing groove, and having a plurality of electrode pads formed on an insulating film; and a plurality of metal wirings for connecting each of the plurality of light-emitting portions to a corresponding electrode pad through the dividing groove, wherein the dividing groove has a wave-shaped sidewall formed on the substrate, the wave shape comprising a first curved surface protruding from a side wall, and a second curved surface that is dented from the side wall.

2. The surface-emitting semiconductor array device according to claim 1, wherein the insulating film of the electrode pad portion extends to side wall and bottom surface of the dividing groove, and the plurality of metal wirings are formed to route on the dividing groove through the insulating film.

3. The surface-emitting semiconductor array device according to claim 1, wherein the dividing groove is filled with polymer resin.

4. The surface-emitting semiconductor array device according to claim 1, wherein the first curved surface and the second curved surface are at least a portion of an ellipse shape, sinusoidal wave shape, or arc shape.

5. The surface-emitting semiconductor array device according to claim 1, wherein the plurality of light-emitting portions are aligned in a first direction, and the wave shape of the dividing groove is formed corresponding to the first direction.

6. The surface-emitting semiconductor array device according to claim 1, wherein the plurality of light-emitting portions are aligned in a plurality of rows in a first direction, and the wave shape of the dividing groove is arranged to oppose to each of the rows of the plurality of light-emitting portions.

7. The surface-emitting semiconductor array device according to claim 1, wherein the dividing groove is formed to surround the plurality of light-emitting portions.

8. The surface-emitting semiconductor array device according to claim 1, wherein the electrode pad portion comprises a second insulating film below the insulating film, and the height from the substrate to the electrode pad is greater than the height from the substrate to the light-emitting portion.

9. The surface-emitting semiconductor array device according to claim 1, wherein each of the plurality of light-emitting portions and the electrode pad portion comprises a plurality of semiconductor layers formed on the substrate, and the dividing groove is formed by etching the semiconductor layers formed on the substrate.

10. The surface-emitting semiconductor array device according to claim 1, wherein each of the plurality of light-emitting portions comprises a post-shaped structure formed by etching the semiconductor layers formed on the substrate and an opening portion for emitting light, and the plurality of electrode wirings extend on the side wall of each post-shaped structure through the insulating film, and connected to an electrode layer formed on a top portion of the post-shaped structure, respectively.

11. The surface-emitting semiconductor array device according to claim 10, wherein the post-shaped structure comprises a current-confined layer made of an oxidized region in which periphery thereof is oxidized and a conductive region surrounded by the oxidized region.

12. A module comprising:
a surface-emitting semiconductor array device;
an electrical connection terminal electrically connected to the surface-emitting semiconductor array device; and an optical component for injecting light emitted from the surface-emitting semiconductor array device, the surface-emitting semiconductor array device comprising a substrate, a plurality of light-emitting portions, an electrode pad portion formed on the substrate and separated from the plurality of light-emitting portions by a dividing groove, and having a plurality of electrode pads formed on an insulating film, and a plurality of metal wirings for connecting each of the plurality of light-emitting portions to a corresponding electrode pad through the dividing groove, wherein the dividing groove has a wave-shaped sidewall formed on the substrate, the wave shape comprising a first curved surface protruding from a side wall, and a second curved surface that is dented from the side wall.

13. A light source device comprising:
a surface-emitting semiconductor array device; and
a projecting unit for projecting light emitted from the surface-emitting semiconductor array device by means of an optical component comprising at least one of a lens and a mirror, the surface-emitting semiconductor array device comprising a substrate, a plurality of light-emitting portions, an electrode pad portion formed on the substrate and separated from the plurality of light-emitting portions by a dividing groove, and having a plurality of electrode pads formed on an insulating film, and a plurality of metal wirings for connecting each of the plurality of light-emitting portions to a corresponding electrode pad through the dividing groove, wherein the dividing groove has a wave-shaped sidewall formed on the substrate, the wave shape comprising a first curved surface protruding from a side wall, and a second curved surface that is dented from the side wall.

14. A data processing apparatus comprising:
a module comprising a surface-emitting semiconductor array device, an electrical connection terminal electrically connected to the surface-emitting semiconductor array device, and an optical component for injecting light emitted from the surface-emitting semiconductor array device; and a transmitting unit for transmitting light emitted from the surface-emitting semiconductor array device, the surface-emitting semiconductor array device comprising a substrate, a plurality of light-emitting portions, an electrode pad portion formed on the substrate and separated from the plurality of light-emitting portions by a dividing groove, and having a plurality of electrode pads formed on an insulating film, and a plurality of metal wirings for connecting each of the plurality of light-emitting portions to a corresponding electrode pad through the dividing groove, wherein the dividing groove has a wave-shaped sidewall formed on the substrate, the wave shape comprising a first curved surface protruding from a side wall, and a second curved surface that is dented from the side wall.

15. A light transmitting device comprising:
a module comprising a surface-emitting semiconductor array device, an electrical connection terminal electrically connected to the surface-emitting semiconductor array device, and an optical component for injecting light emitted from the surface-emitting semiconductor array device; and a transmitting unit for transmitting light emitted from the surface-emitting semiconductor array device, the surface-emitting semiconductor array device comprising a substrate, a plurality of light-emitting portions, an electrode pad portion formed on the substrate and separated from the plurality of light-emitting portions by a dividing groove, and having a plurality of electrode pads formed on an insulating film, and a plurality of metal wirings for connecting each of the plurality of light-emitting portions to a corresponding electrode pad through the dividing groove, wherein the dividing groove has a wave-shaped sidewall formed on the substrate, the wave shape comprising a first curved surface protruding from a side wall, and a second curved surface that is dented from the side wall.

16. A light spatial transmitting apparatus comprising:

a module comprising a surface-emitting semiconductor array device, an electrical connection terminal electrically connected to the surface-emitting semiconductor array device, and an optical component for injecting light emitted from the surface-emitting semiconductor array device; and a transmitting unit for spatially transmitting light emitted from the surface-emitting semiconductor array device, the surface-emitting semiconductor array device comprising a substrate, a plurality of light-emitting portions, an electrode pad portion formed on the substrate and separated from the plurality of light-emitting portions by a dividing groove, and having a plurality of electrode pads formed on an insulating film, and a plurality of metal wirings for connecting each of the plurality of light-emitting portions to a corresponding electrode pad through the dividing groove, wherein the dividing groove has a wave-shaped sidewall formed on the substrate, the wave shape comprising a first curved surface protruding from a side wall, and a second curved surface that is dented from the side wall.

17. A light spatial transmitting system comprising:

a module comprising a surface-emitting semiconductor array device, an electrical connection terminal electrically connected to the surface-emitting semiconductor array device, and an optical component for injecting light emitted from the surface-emitting semiconductor array device; and a transmitting unit for spatially transmitting light emitted from the surface-emitting semiconductor array device, the surface-emitting semiconductor array device comprising a substrate, a plurality of light-emitting portions, an electrode pad portion formed on the substrate and separated from the plurality of light-emitting portions by a dividing groove, and having a plurality of electrode pads formed on an insulating film, and a plurality of metal wirings for connecting each of the plurality of light-emitting portions to a corresponding electrode pad through the dividing groove, wherein the dividing groove has a wave-shaped sidewall formed on the substrate, the wave shape comprising a first curved surface protruding from a side wall, and a second curved surface that is dented from the side wall.

* * * * *